(12) United States Patent
Bryant et al.

(10) Patent No.: US 6,436,744 B1
(45) Date of Patent: Aug. 20, 2002

(54) METHOD AND STRUCTURE FOR CREATING HIGH DENSITY BURIED CONTACT FOR USE WITH SOI PROCESSES FOR HIGH PERFORMANCE LOGIC

(75) Inventors: Andres Bryant; Jerome B. Lasky; Edward J. Nowak, all of Essex Junction; Jed H. Rankin, S. Burlington, all of VT (US); Minh H. Tong, Fuquay-Varina, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/809,888

(22) Filed: Mar. 16, 2001

(51) Int. Cl.⁷ ............................................. H01L 21/00
(52) U.S. Cl. ..................... 438/151; 438/151; 438/155; 438/249
(58) Field of Search ................. 438/151, 155, 438/249, 305, 307; 257/506, 524, 725

(56) References Cited

U.S. PATENT DOCUMENTS

| | | |
|---|---|---|
| 3,936,331 A | 2/1976 | Luce et al. |
| 4,778,775 A | 10/1988 | Tzeng |
| 5,130,770 A | 7/1992 | Blanc et al. |
| 5,294,821 A | 3/1994 | Iwamatsu |
| 5,374,572 A | 12/1994 | Roth et al. |
| 5,508,219 A | 4/1996 | Bronner et al. |
| 5,525,531 A | 6/1996 | Bronner et al. |
| 5,654,573 A | 8/1997 | Oashi et al. |
| 5,770,484 A * | 6/1998 | Kleinhenz ............ 438/155 |
| 5,804,858 A | 9/1998 | Hsu et al. |
| 5,945,712 A | 8/1999 | Kim |
| 5,959,335 A | 9/1999 | Bryant et al. |
| 6,013,936 A * | 1/2000 | Colt, Jr. ................ 257/345 |
| 6,204,138 B1 * | 3/2001 | Krishnan et al. ......... 438/151 |

* cited by examiner

*Primary Examiner*—David Nelms
*Assistant Examiner*—Mai-Huong Tran
(74) *Attorney, Agent, or Firm*—Schmeiser, Olsen & Watts; Richard A. Henkler (57) ABSTRACT

A semiconductor device having an SOI FET comprising a silicon body on an insulating layer on a conductive substrate. A gate dielectric and a gate are provided on a surface of the silicon body, and a source and a drain are provided on two sides of the gate. A buried body contact to the substrate conductor is provided below a third side of the gate. The buried body contact does not extend to the top surface of the silicon body. The body contact is separated from the gate by a second dielectric having a thickness typically greater than that of the gate dielectric. The body contact is a plug of conductive material, and the second dielectric coats the body contact under the gate. The FET can be used in an SRAM circuit or other type of circuit having a silicon-on-insulator (SOI) construction.

13 Claims, 11 Drawing Sheets

METHOD AND STRUCTURE FOR CREATING HIGH DENSITY BURIED CONTACT FOR USE WITH SOI PROCESSES FOR HIGH PERFORMANCE LOGIC

BACKGROUND OF THE INVENTION

1. Technical Field

The Technical field of the invention is that of semiconductors, in particular silicon-on-insulator (SOI) structures.

2. Related Art

Figure 1A:
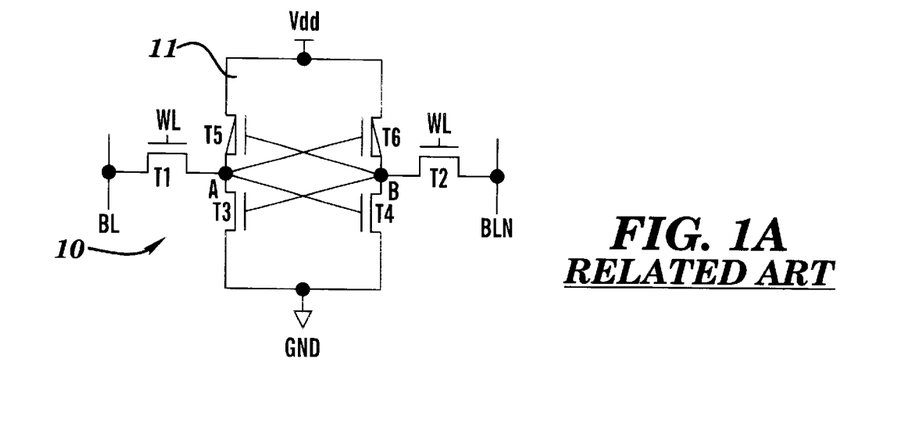
FIG. 1A is a schematic view of a conventional SRAM cell circuit.
Figure 1B:
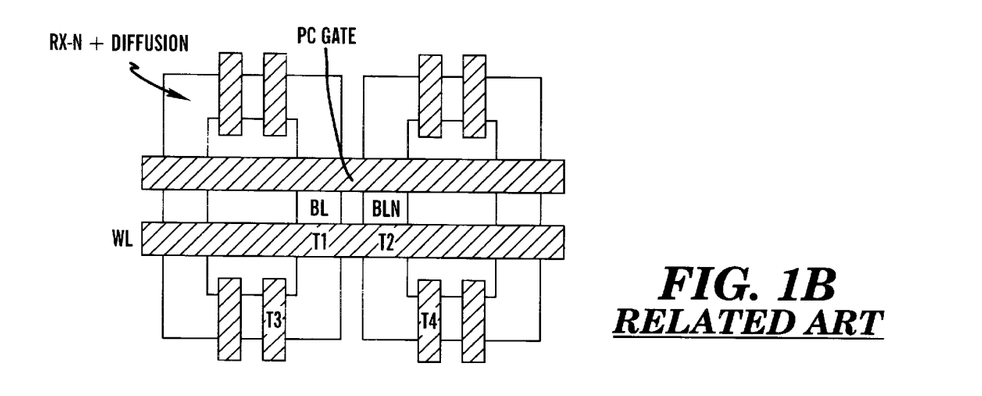
FIG. 1B is a plan view of a physical structure of the NFETs of two of the SRAM cells shown in FIG. 1A.

A cell circuit schematic of a static random access memory (SPAM) 10 is shown in FIG. 1A. NFETs T1 and T2 are two input-output (IO) devices connecting a bit line BL and a complementary bit line BLN to a cell latch 11. The NFETs T3 and T4, and the PFETs T5 and T6, form the cell latch 11. In bulk technology, all the NFETs T1–T4 share a same grounded substrate or body. In silicon-on-insulator (SOI) technology, however, each NFET T1–T4 has its own floating p-type body. The SOI PFETs T5 and T6 also have their own n-type bodies. FIG. 1B provides a plan view of the NFETs T1–T4 of a physical structure that makes up the electrical circuit of the SRAM 10 represented in FIG. 1A.

SRAM cell stability is reduced due to floating body effects when the SRAM cell is built on silicon-on-insulator (SOI) structures. There are two weaknesses inherent in the floating body. First, the capacitances from the various array nodes (bit-line, true, complement, etc.) to the device bodies swing the body voltages of the NFETs in the cell and transfer devices from voltages of −0.5V to Vdd (see FIG. 1A) above ground, depending on the history of use of the array. Second, minor defects resulting in leakages to NFET bodies, of the order of only micro amperes, can further mismatch body bias among the NFETs in the cell.

The mismatch within the cell can be aggravated by the floating bodies and needs to be lessened or eliminated to avoid a cell read error. The differences in the body voltages of the passgate NFETS contribute directly to the cell instability. The smaller the voltage difference during switching, the more reliable the data output will be.

Figure 1C:
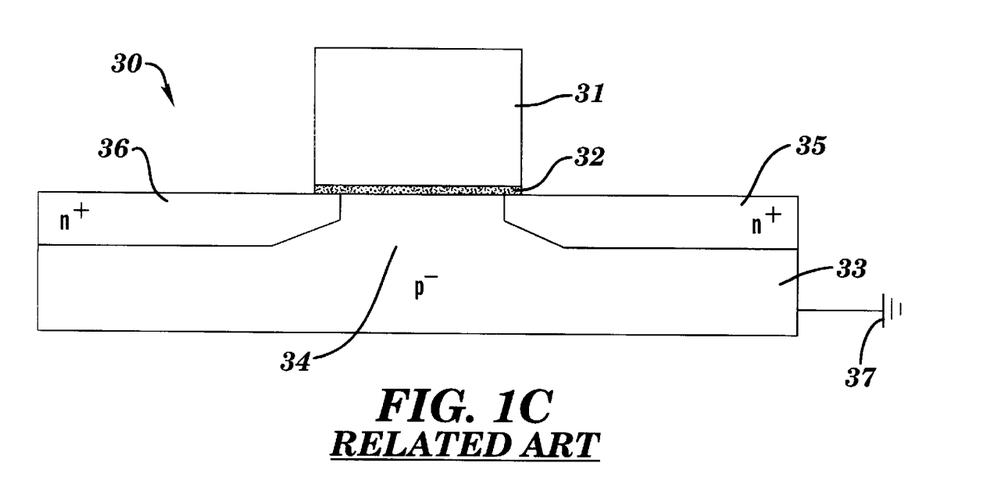
FIG. 1C is schematic representation of a conventional bulk wafer FET.

A conventional bulk wafer FET 30 is shown in FIG. 1C and includes a metal or semiconductor gate 31 on a gate dielectric 32, such as silicon dioxide, which insulates the gate 31 from a silicon wafer 33. A region under the gate dielectric 32 comprises a silicon body 34 formed by type dosing of the silicon wafer 33. FIG. 1C shows the FET 30 as an NFET having p-type doping of the silicon wafer 33. If the FET 30 were a PFET, the doping of the silicon wafer 33 would be n-type doping. The silicon body 34 acts as a source or sink for combination of electron/hole pairs during the FET 30 operation. A source 35 is provided under the gate 31 and on a first side of the gate 31, and a drain 36 is provided under the gate 31 and on a second side of the gate 31.

In operation of the conventional bulk wafer FET 30, a voltage is applied to the source 35 or the drain 36, depending upon whether the FET 30 is a NFET or a PFET. When no voltage is applied to the gate 31, almost no current will flow between the source 35 and the drain 36 and the FET 30 is OFF. When a voltage is applied to the gate 31, electrons or holes form an inversion channel in the body 34 underneath the gate 31. This allows conduction between the source 35 and the drain 36. Thus, a current flows from the source 35 to the drain 36, and the device is ON. The boundaries of the source 35 and the drain 36 are not perfect, and current leaks to the body 34 in both the ON and OFF states. Since the body 34 is grounded to a ground 37, there is a path to the ground 37 for excess holes or electrons to dissipate rapidly. While the conventional bulk wafer FET 30 does not suffer from floating body effects, the FET 30 does not benefit from advantages afforded by SOI structures.

In the operation of a SOI FET, the electrons or holes that leak from the source/drain to the body have no path by which to dissipate. Thus the charge gets stored in the body, which changes the body voltage and the threshold voltage of the device, making the cell unstable.

A method and structure is needed for avoiding floating body effects when SOI structures are used.

SUMMARY OF THE INVENTION

The present invention provides a semiconductor structure, comprising:

a conductive substrate;

an insulating layer on the conductive substrate;

a semiconductor device layer on the insulating layer, wherein the semiconductor device layer includes a semiconductor material;

a conductive buried body contact in conductive contact with the conductive substrate, wherein the buried body contact extends through the insulating layer and through less than a total thickness of the semiconductor device layer, and wherein the buried body contact conductively contacts a region of the semiconductor device layer, said region including the semiconductor material.

The present invention provides a method of forming and using a semiconductor structure, comprising the steps of:

providing a silicon-on-insulator structure having a conductive substrate, an insulating layer on the conductive substrate, and a semiconductor device layer on the insulating layer, wherein the semiconductor device layer includes a semiconductor material;

forming a first trough that extends through the semiconductor device layer and through the insulating layer; and forming a conductive buried body contact in the first trough and in conductive contact with the conductive substrate, wherein the buried body contact extends through the insulating layer and through less than a total thickness of the semiconductor device layer to a height H above a top surface of the conductive substrate, and wherein the buried body contact conductively contacts a region of the semiconductor device layer, said region including the semiconductor material.

The present invention provides a method and structure which avoids floating body effects when SOI structures are used.

The present invention may be used with a SRAM circuit or other types of circuits using silicon-on-insulator (SOI) constructions.

The present invention reduces cell instability and obtains high performance logic and SRAMs in a high performance SOI semiconductor device.

BRIEF DESCRIPTION OF THE DRAWINGS

The present invention will become more clearly appreciated as the disclosure of the invention is made with reference to the accompanying drawings. In the drawings.

DETAILED DESCRIPTION OF THE INVENTION

The present invention will now be described in detail with reference to FIGS. 2, 3A, 3B, and 4–26 of the accompanying drawings.

Figure 2:
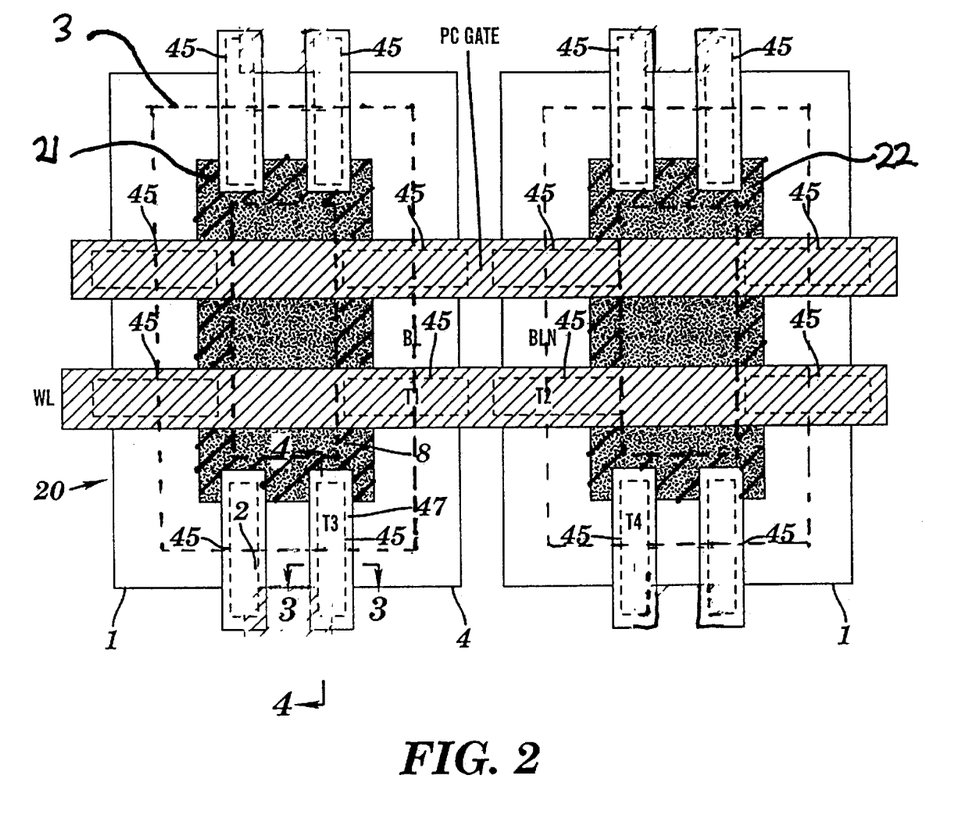
FIG. 2 is a plan view of the physical structure of a silicon-on-insulator (SOI) SRAM comprising buried body contacts between a silicon wafer substrate and silicon bodies of SOI field effect transistors (FETs) T1, T2, T3, and T4, in accordance with embodiments of the present invention.

FIG. 2 is a plan view of the physical structure of a silicon-on-insulator (SOI) SRAM 20 comprising buried body contacts 21–22 between a silicon wafer substrate and silicon bodies 45 of SOI field effect transistors (FETs) T1–T4, in accordance with embodiments of the present invention. Included within outer rectangles 1 are silicon bodies of an active silicon layer. Shallow trench isolations (STIs) (not shown) are outside of, and in contact with, the outer rectangles 1. STI 8 is shown as cross hatched under portions of FETS T1–T4, as well as under a portion of a PC gate. The rectangles enclosing the labels "T1," "T2," "T3," and "T4" define the physical extent in top view of gates of FETS T1, T2, T3, and T4, respectively. The dotted rectangle 3 defines a mask area for forming the body contact 21. An upper area of the dotted rectangle 3, wherein said upper area is interior to the outer rectangle 1, does not overlay the body contact 21, but instead represents a tolerance mask area for forming the body contact 21 so as to assure that the so formed body contact 21 actually contacts the silicon of the active silicon body 45.

Figure 3A:
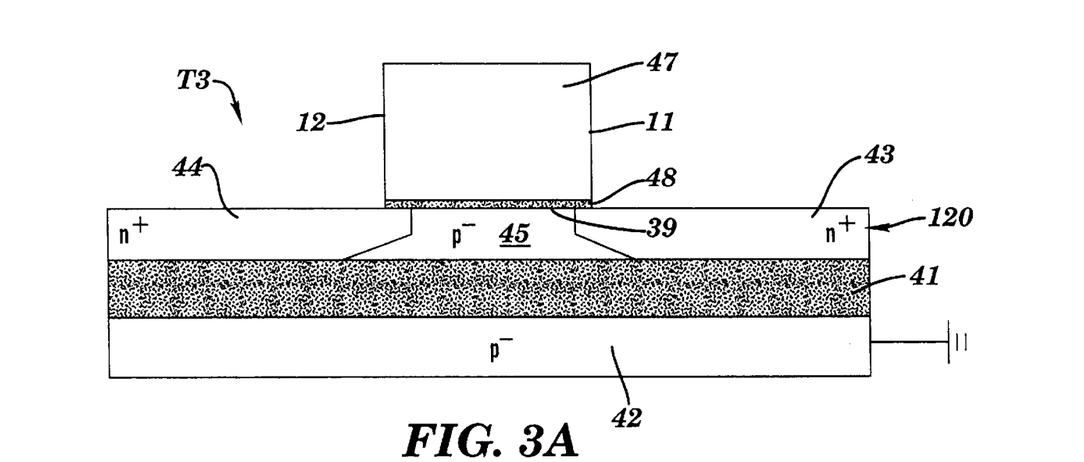
FIG. 3A depicts a cross-sectional view taken along line 3—3 of FIG. 2, showing the FET (T3) on a buried oxide layer.

FIG. 3A illustrates a cross-sectional view taken along line 3—3 of FIG. 2, showing the FET (T3) on a buried oxide (BOX) layer 41. The SOI FET T3 comprises a gate 47, a gate dielectric 48 under the gate 47, a source 43 below the gate dielectric 48 and positioned sidewise relative to a first side 11 of the gate 47, and a drain 44 below the gate dielectric 48 and positioned sidewise relative to a second side 12 of the gate 47. The source 43 and the drain 44 are on the BOX 41. The BOX 41 is on a conductive silicon wafer substrate 42. The silicon body 45 is: on the BOX layer 41, below the gate dielectric 48, between the source 43 and the drain 44, and conductively coupled to the source 43 and the drain 44. The silicon body 45 is within an active silicon layer 120 which includes silicon such as p⁻ doped silicon. The source 43 and the drain 44 are likewise within the active silicon layer 120. The source 43 and the drain 44 have been formed within the active silicon layer 120 by any method known to one of ordinary skill in the art such as by known ion implantation methods. Similarly, the gate dielectric 48 and the gate 47 have been formed by any method known to one of ordinary skill in the art.

FIG. 3A shows the body of FET T3 as an NFET having p⁻ doping of the silicon wafer substrate. If the FET T3 were a PFET, the silicon body 45 would be N⁻ doping.

Figure 3B:
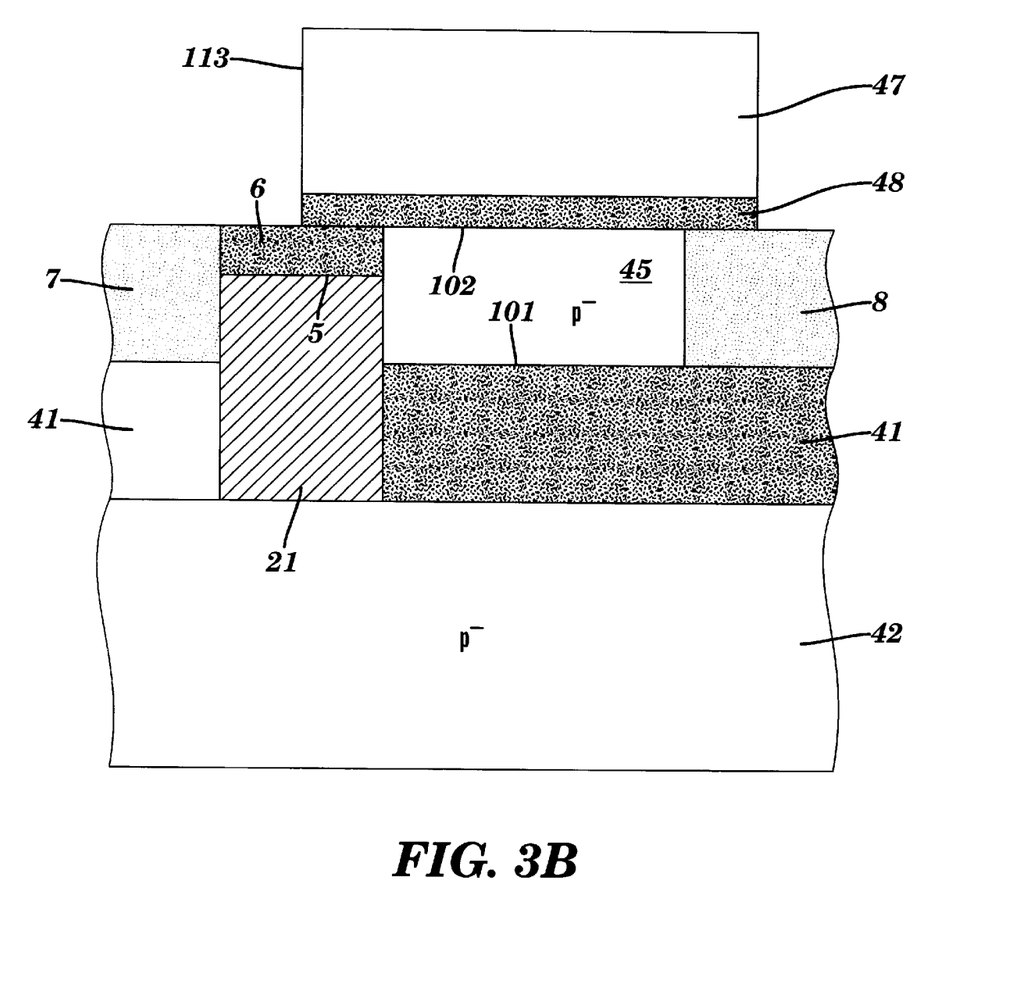
FIG. 3B depicts a cross-sectional view taken along line 4—4 of FIG. 2, showing a buried body contact conductively coupling the FET (T3) silicon body to the silicon wafer substrate.

FIG. 3B illustrates a cross-sectional view taken along line 4—4 of FIG. 2, showing the buried body contact 21 conductively coupling the FET T3 silicon body 45 to the silicon wafer substrate 42. The conductive buried body contact 21, which may include, inter alia, polysilicon, is on the conductive silicon wafer substrate 42 and in conductive contact with the silicon wafer substrate 42. The buried body contact 21 passes through the BOX layer 41 and has a top surface 5 which is above a bottom surface 101 of the silicon body 45 and below the top surface 102 of the silicon body 45. The buried body contact 21 is adjacent to, and in conductive contact with, the silicon body 45. The buried body contact 21 is positioned sidewise relative to a third side 113 of the gate 47 (the first side 11 and second side 12 of the gate 47 were identified in FIG. 3A and discussed supra). An oxide layer 6 is on the buried body contact 21 and extends upward to approximately the same level as the top surface 102 of the silicon body 45. The STI 8 insulatively isolates a right side of the silicon body 45 and the body contact 21. A STI 7, together with the BOX 41, insulatively isolates a left side of the silicon body 45. The STI 7 is a portion of the STIs identified supra in conjunction with FIG. 2 as being located outside of, and in contact with, the outer rectangles 1 of FIG. 2. The gate dielectric 48 is on: the silicon body 45, a portion of the oxide 6, and a portion of the STI 8. The gate 47 is on the gate dielectric 48.

The oxide layer 6 is on the buried body contact 21 and insulatively separate the buried body contact 21 from the gate 47. Although the gate dielectric 48 can also insulatively separate the buried body contact 21 from the gate 47, the gate dielectric 48 is typically much thinner than the oxide layer 6 and may fail to provide said insulative separation due to such factors as an imperfection in its fabrication or deterioration over the operational lifetime of the FET T3. Nonetheless, if the gate dielectric 48 can be relied upon to provide the required insulative separation between the buried body contact 21 and the gate 47, then the oxide 6 can be omitted.

If the buried body contact 21 were absent, then the BOX 41 would insulate all parts of the SOI FET T3 from the conductive silicon wafer substrate 42 and the silicon body 45 voltage would vary with source 43, drain 44, and gate 47 voltages. Depending on the voltage of the silicon body 45, there will be more or less current, in a predictable amount, passing from the source 43 to the drain 44 (see FIG. 3A) during the ON state of the FET T3. In contrast, the buried body contact 21 conductively couples the silicon body 45 to the conductive silicon wafer substrate 42, which stabilizes the voltage on the silicon body 45.

Figure 4:
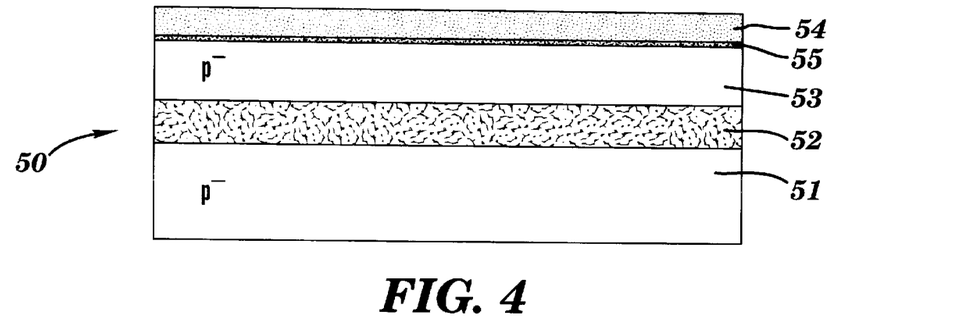
FIGS. 4 through 16 illustrate in cross-sectional view fabrication of an SOI semiconductor device having a buried body contact, at various points in the fabrication process according to a first example of the present invention.

Referring to FIG. 4, there is illustrated in cross section a silicon-on-insulator (SOI) semiconductor device 50 at the beginning of a fabrication process according to a first example of the present invention. The device 50 has a conductive substrate 51 (e.g., semiconductor substrate, metallic substrate, etc.) in the form of a silicon wafer substrate shown at the bottom, and a buried oxide (BOX)

layer 52 covering the substrate. An active silicon layer 53 is formed above the buried oxide layer 52. A pad nitride layer 54 is formed above the active silicon layer 53. An oxide layer 55 is formed between the pad nitride layer 54 and the active silicon layer 53 and is used to absorb stresses from thermal expansion to prevent cracks and dislocations from forming in a surface 38 of the active silicon layer 53. While both the silicon wafer substrate 51 and the active silicon layer 53 are shown in FIG. 4 as comprising semiconductor material having p-type doping for fabricating a semiconductor device such as an NFET, the silicon wafer substrate 51 and the active silicon layer 53 may alternatively comprise semiconductor material having n-type doping for fabricating a semiconductor device such as a PFET, or the active silicon layer 53 may be neutrally or intrinsically doped. While the active silicon layer 53 is described herein as including silicon, the active silicon layer 53 is an embodiment of a semiconductor device layer generally which includes a semiconductor material such as, inter alia, silicon. The semiconductor device layer generally is within the scope of the present invention.

The following thicknesses of the various layers of the device 50 are provided by way of example and should not be considered as limiting the present invention. The oxide layer 55 is about 60 angstroms thick, while the pad nitride layer 54 is about 3,000 angstroms thick. The active silicon layer 53 is between about 500 and about 3,000 angstroms thick. The buried oxide layer 52 is between about 1,000 and about 4,000 angstroms thick.

Figure 5:
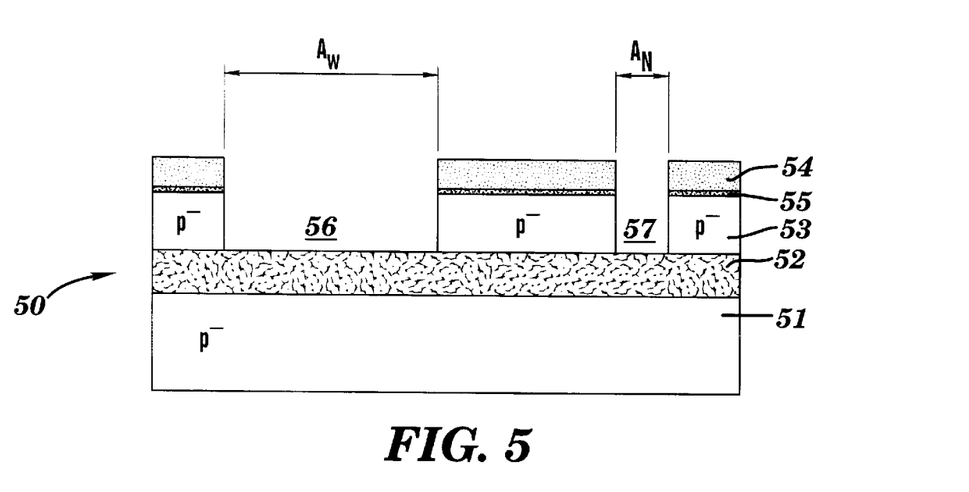

As shown in FIG. 5, the device 50 is etched using a shallow trench isolation (STI) trough etch. The STI trough etch uses any etching process known to one of ordinary skill in the art (e.g., a reactive ion etch) that etches through the pad nitride 54, the oxide 55 and the active silicon layer 53. The STI troughs 56 and 57 formed by this etching process function to divide the active silicon layer 53 into isolated silicon regions. A single device or multiple devices can be formed on each such isolated silicon region that remains after this etch.

The STI trough 56 formed on the left side of the device 50 has a relatively wide cross-sectional area $A_W$, and the STI trough 57 formed on the right side has a relatively narrow cross-sectional area $A_N$. The relatively wide STI trough 56 on the left will be used to form a substrate contact that electrically connects the silicon wafer substrate 51 to, inter alia, the circuit ground (not shown), The relatively narrow STI trough 57 on the right will be used to form a buried body contact (BC) according to the present invention.

Figure 6:
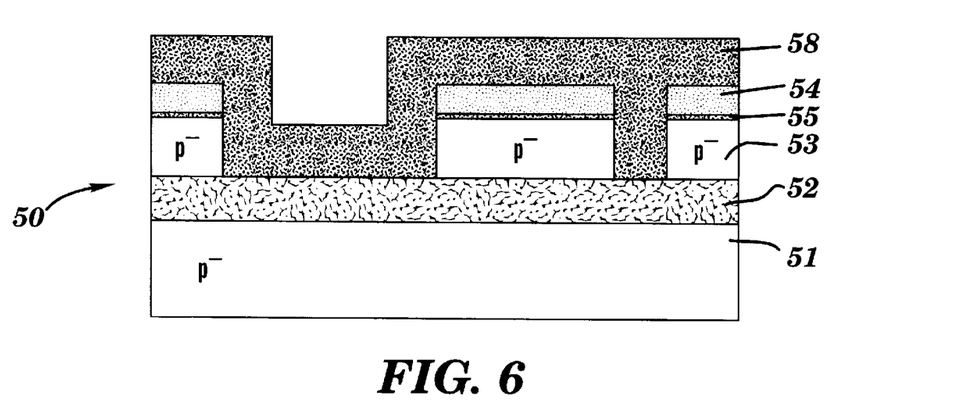

As shown in FIG. 6, an STI oxide 58 (e.g., silicon dioxide or other dielectric material) is deposited to fill in the relatively narrow STI trough 57 on the right completely, and the relatively wide STI trough 56 on the left partially. The STI oxide 58 is very conformal and follows the contours of the surfaces on which it is deposited.

Figure 7:
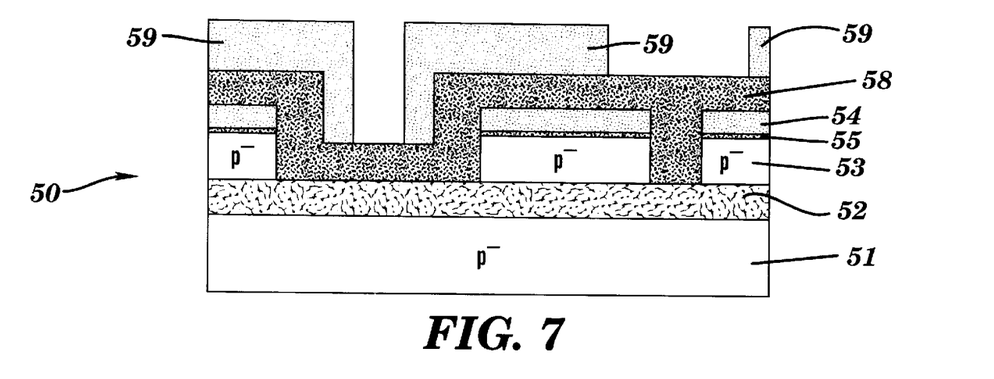
Figure 8:
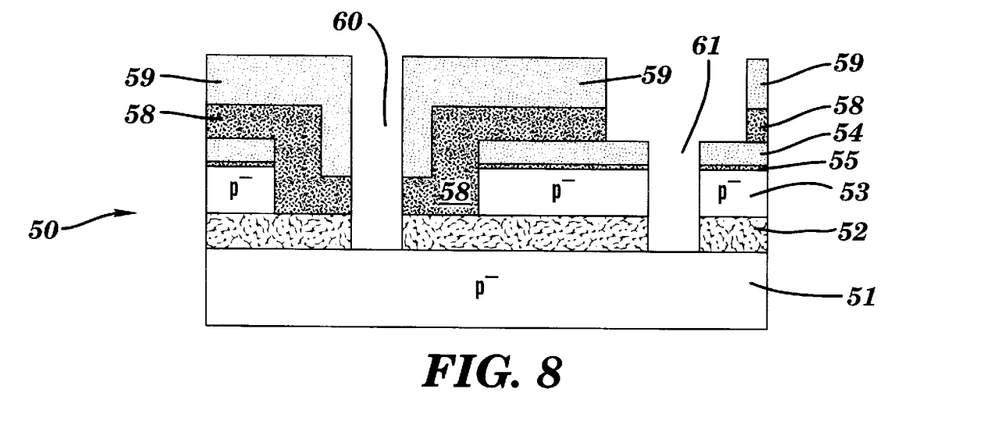

As shown in FIG. 7, a photoresist mask 59 is applied over the STI oxide 58 and then developed after exposure to radiation (e.g., ultraviolet radiation). In FIG. 8, a selective BI etch has been utilized to form etched troughs 60 and 61 in the open areas defined by the mask 59. The BI etch may be, inter alia, a reactive ion etching (RIE). This BI etch is selective to nitride so that it does not etch the pad nitride layer 54 shown on the right side of FIG. 8. The BI etch must also be highly directional such that the BI etch does not undercut the pad nitride 54 on the right side of FIG. 8. The etched troughs 60 and 61 continue straight down through the STI oxide 58 and the buried oxide layer 52 until the etched troughs 60 and 61 directly contact the silicon wafer substrate 51.

Figure 9:
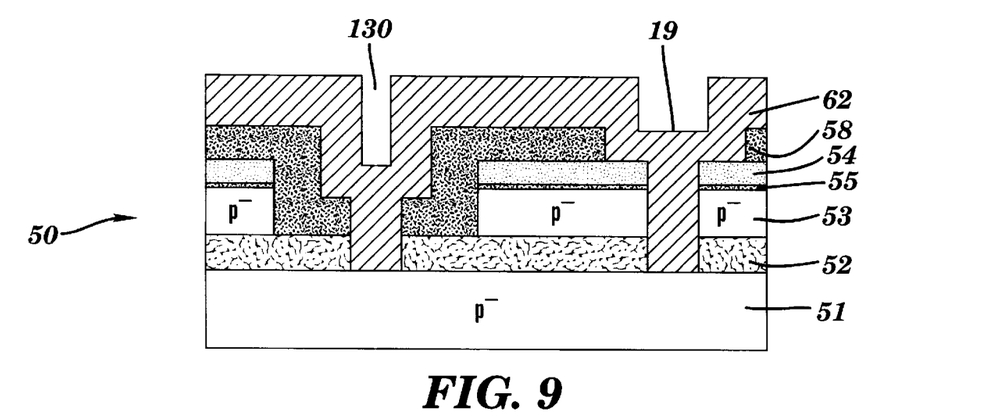

In the next step shown in FIG. 9, the photoresist mask 59 (see FIG. 8) is removed and a BI polycrystalline silicon (poly) 62 is deposited to fill the etched troughs 60 and 61. The deposited poly 62 also functions in polishing to prevent excessive dishing (i.e., it prevents any places from getting too thin during polishing). The deposited poly 62 can cover any of the silicon regions of the active silicon layer 53. During this step, enough poly is applied to completely fill the etched trough 61 on the right side of FIG. 8 such that a top surface 19 of the poly 62 that is directly above the trough 61 (see FIG. 8) is substantially planar. The poly partially fills the etched trough 60, leaving a depression 130 in the poly 62 corresponding to the location of the etched trough 60.

The poly 62 makes contact with the silicon wafer substrate 51 on both the left side (where the substrate contact will be formed) and the right side (where a new buried body contact will be formed). On the right side, the poly 62 will provide the buried body contact that electrically connects the active silicon layer 53, referred to herein as the silicon body, to the silicon wafer substrate 51. On the left side, the poly 62 will provide a substrate contact used to ground devices using some of the metallurgy applied after the devices are formed, in a way that is known in the art.

When the device being formed is a NFET, the poly 62 can be p-doped to provide the desired characteristics for the device. Similarly, when the device being formed is a PFET, the poly can be n-doped. Alternatively, in the case where improved electrostatic discharge or other electrical characteristics are desired, a n-doped poly 62 can be used for the NFET and a p-doped poly 62 can be used for the PFET. Alternatively, in some cases the poly 62 can be undoped and still achieve the desired electrical characteristics. Additionally, depending on the application, the poly 62 can be replaced by another electrically conductive material such as, inter alia, tungsten, aluminum, other metals, or semiconductors.

Figure 10:
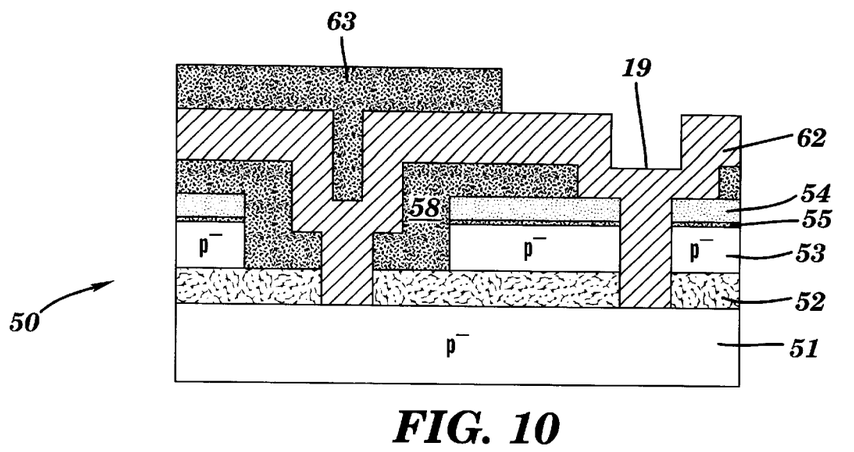
Figure 11:
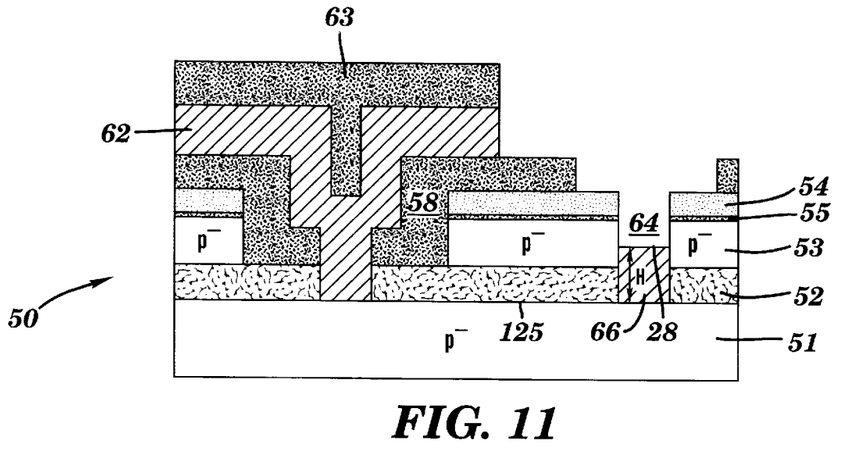

In the next step shown in FIG. 10, a buried contact (BC) block resist mask 63 is formed on a left portion of the poly 62. The BC block resist mask 63 blocks the substrate contact region (i.e., a portion of the poly 62 that fills the etched depression 130 (see FIG. 9)) on the left side, and leaves exposed the poly 62 on the right side where the buried body contact will be formed (i.e., where the poly 62 fills the etched trough 61 (see FIG. 8)). A reactive ion etch (RIE) poly etch back process (or other applicable process as would be known to one of ordinary skill in the art) is then performed, as shown in FIG. 11, to remove a portion of the exposed poly 62 from the right side to form a trough 64.

As explained in conjunction with FIG. 9 and shown in FIG. 10, the top surface 19 of the portion of the poly 62 that indirectly above the trough 61 is substantially planar. Therefore, when the RIE etch is directed downward into the trough 64 below the top surface of the pad nitride 54, the RIE etch forms a flat surface at the top surface 28 of the portion of the poly 62 that is in the trough 64, which forms a body contact 66 from said portion of the poly 62. The portion of the poly 62 is etched back a distance so that a final height H of the body contact 66 (also, said portion of the poly 62) above a top surface 125 of the silicon wafer substrate, and within the trough 64, is somewhere within the height range of the active silicon layer 53 and below a top surface 38 of the active silicon layer 53.

Figure 12:
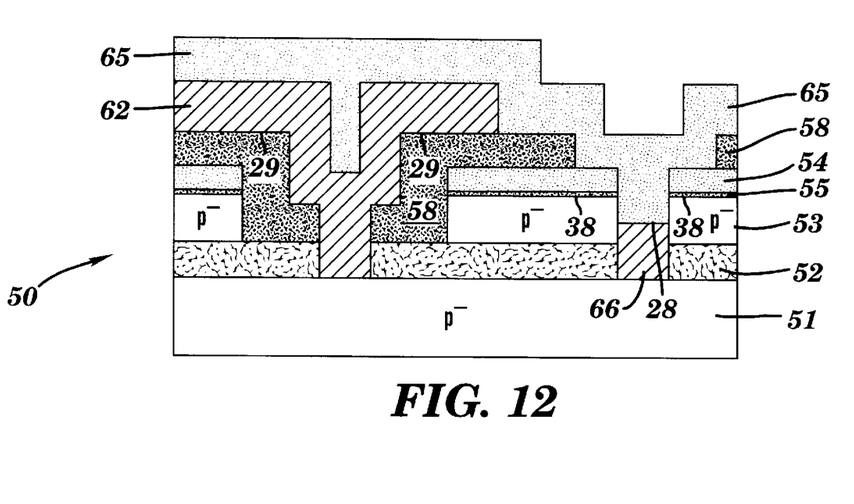

The next step, as shown in FIG. 12, is applying an oxide layer 65 (e.g., silicon dioxide or other dielectric material) as shown. A purpose of the oxide layer 65 is to fill in the trough 64 (see FIG. 11) above the body contact 66 (or said portion of the poly 62) within the lower narrow portion of the trough 64. The oxide layer 65, a dielectric layer which will be formed between a top surface 28 of the now-formed buried body contact 66 and the top surface 38 of the active silicon layer 53, as will be described infra in conjunction with FIGS. 13–15.

Figure 13:
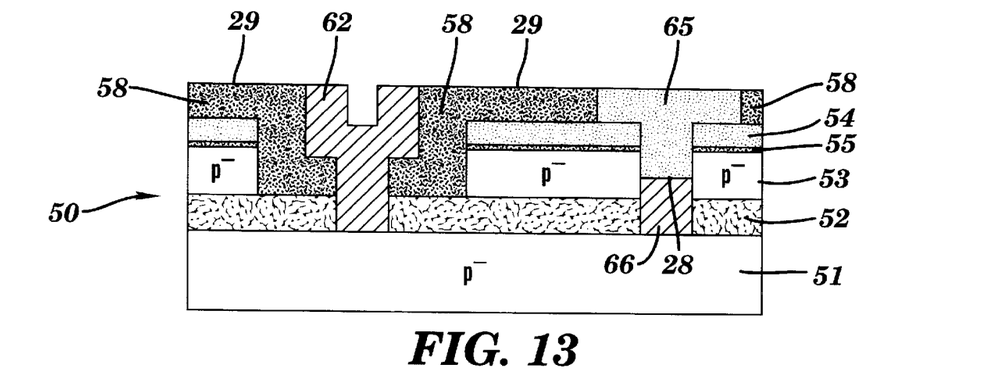

After the oxide layer 65 is deposited, a planarization to a top surface 29 of the STI oxide 58 is performed, as shown in FIG. 13. The planarization includes a poly polish, which polishes down the flat areas of the poly 62 and grinds through the oxide layer 65 to the top surface 29 of the STI oxide 58.

Figure 14:
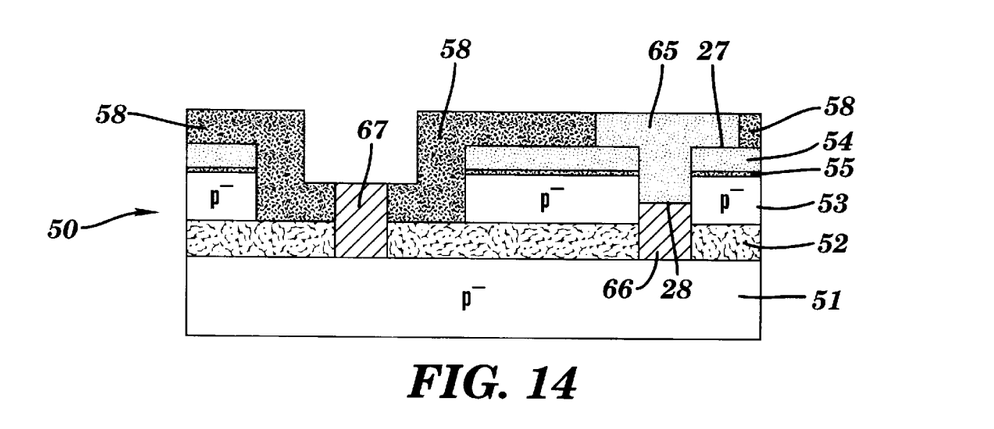

The next step, as shown in FIG. 14, is to perform a poly RIE back etching process, which is selective to the oxide layer 65. The RIE back etches the poly 62 lo remove the U-shaped portion of the poly 62 to form a substrate contact 67. The RIE back etch does not etch the oxide layers of the STI oxide 58 and the oxide layer 65.

Figure 15:
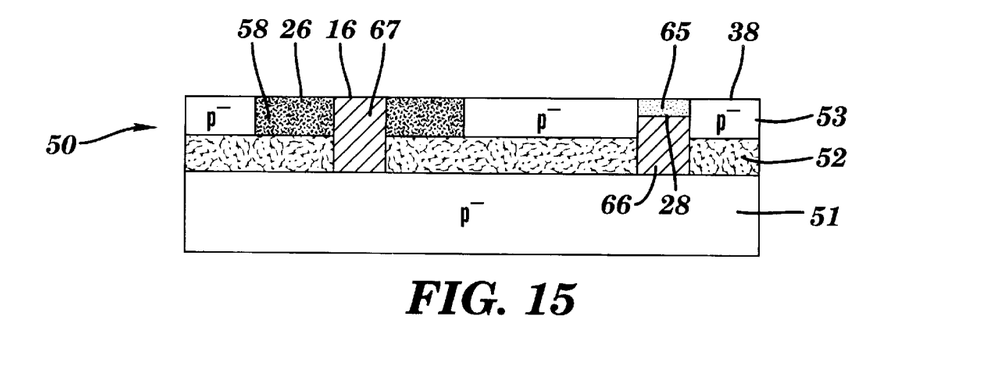

The next step, as shown in FIG. 15, is to perform an oxide polish which planarizes the oxide layers of the STI oxide 58 and the oxide layer 65 back to a top surface 27 (see FIG. 14) of the pad nitride layer 54. A nitride removal is then performed to remove the nitride layer 54, leaving the structure shown in FIG. 15. A top surface 26 of the remaining STI oxide 58 around the substrate contact 67 on the left side is substantially coplanar with a top surface 16 of the substrate contact 67. The substrate contact 67 is exposed so that it can be contacted in accordance with subsequent processing steps.

On the right half of FIG. 15, the buried body contact 66, is covered by the oxide layer 65. The oxide layer 65 is a dielectric layer between the top surface 28 of the buried body contact 66 and the top surface 38 of the active silicon layer 53. The buried body contact 66 is in the form of a plug of conductive poly material that extends down to the silicon wafer substrate 51 but does not extend to the top surface 38 of the active silicon layer 53. Thus, if a metal layer or other electrically conductive matter were to land over the buried body contact 66, the metal layer would not electrically short to the buried body contact 66. The buried body contact 66 only touches a bottom portion of the active silicon layer 53 and does not extend to the top surface 38 thereof.

It is noted that a gate dielectric and gate may be subsequently formed on an isolated silicon region of the active silicon layer 53, such as the gate dielectric 48 and gate 47 which were described supra in conjunction with FIGS. 2, 3A, and 3B. Such a gate dielectric may have a thickness of the order of, inter alia, approximately 20 angstroms. Noting that the oxide layer 65 may have a thickness of, inter alia, approximately 250 to 1,500 angstroms, the thickness of the oxide layer 65 may be substantially greater than the thickness of the gate dielectric.

Figure 16:
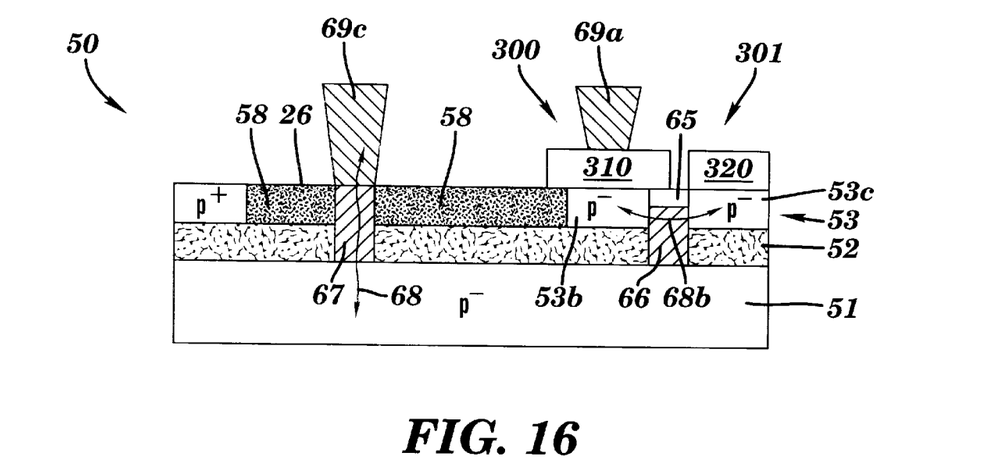

As shown in FIG. 16, conduction paths 68 connects the silicon wafer substrate 51, the substrate contact 67, and the conductive contact 69c. This conductive contact 69c and its associated conduction path 68 is used to electrically bias or short the silicon wafer substrate 51. Conduction path 68b connects the bodies 53b and 53c of FETs 300 and 301 to the wafer substrate 51 through body contact 66. Also shown is the polysilicon gate 310 disposed between the conductive contact 69a and the body 53b, and the polysilicon gate 320 on the body 53c.

Additionally, a conduction path extends to the top surface 26 of the oxide layer 58 above the substrate contact 67 on the left side, allowing a direct connection between the substrate contact 67 and a conductive contact 69c placed on the substrate contact 67.

A fabrication process according to a second example of the present invention will now be described with reference to FIGS. 17 to 26 of the drawings.

The fabrication process according to this second example does not use any additional masks as compared with a conventional process. This is an advantage because the use of such masks requires expensive photolithography steps. On the other hand, the process does not result in a direct substrate interconnect being formed along with the buried body contact of the present invention.

Figure 17:
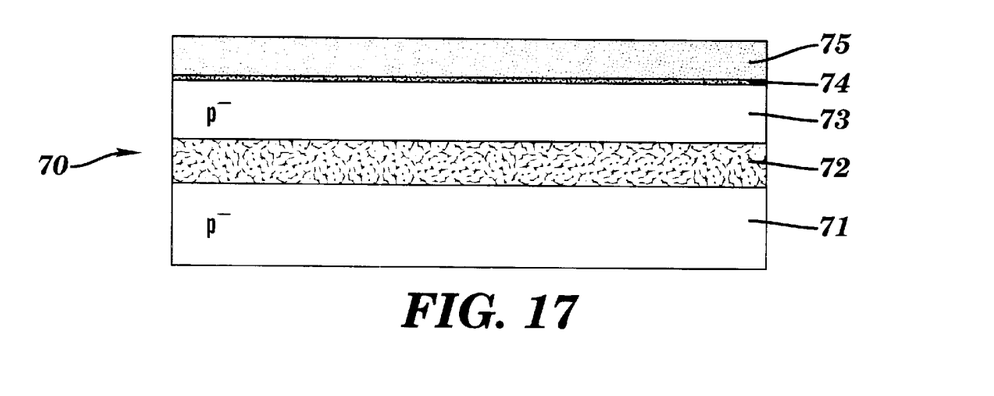
FIGS. 17 through 26 illustrate in front cross-sectional view fabrication of an SOI semiconductor device having a buried body contact, at various points in the fabrication process according to a second example of the present invention.

In FIG. 17 in this process according to this second example, a semiconductor device 70 at the beginning of the process is the same as the semiconductor device 50 in the first example. The semiconductor device 70 has a conductive substrate 71 (e.g., semiconductor substrate, metallic substrate, etc.) in the form of a silicon wafer substrate, a buried oxide (BOX) layer 72 on the silicon wafer substrate 71, an active silicon layer 73 on the buried oxide layer 72, an oxide layer 74 on the active silicon layer 73, and a pad nitride layer 75 on the oxide layer 74. While both the silicon wafer substrate 71 and the active silicon layer 73 are shown in FIG. 4 as comprising semiconductor material having p-type doping for fabricating a semiconductor device such as an NFET, the silicon wafer substrate 71 and the active silicon layer 73 may alternatively comprise semiconductor material having n-type doping for fabricating a semiconductor device such as a PFET. While the active silicon layer 73 is described herein as including silicon, the active silicon layer 73 is an embodiment of a semiconductor device layer generally which includes a semiconductor material such as, inter alia, silicon. The semiconductor device layer generally is within the scope of the present invention.

Figure 18:
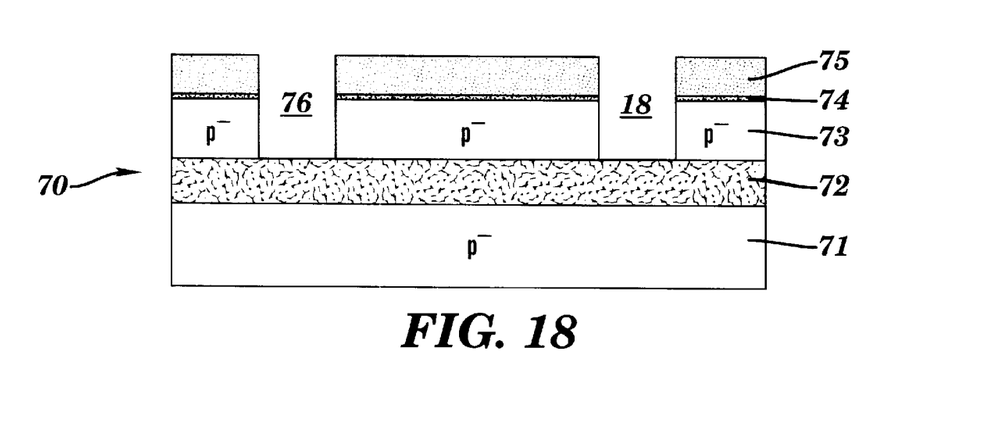

An STI trough etch is then applied to form troughs 76 and 18, as shown in FIG. 18, similar to the STI trough etch described above in reference to FIG. 5. However, the trough 76 on the left side of FIG. 18 is relatively narrow, in contrast with the relatively wide STI trough 56 on the left side of FIG. 5 of the first example.

Figure 19:
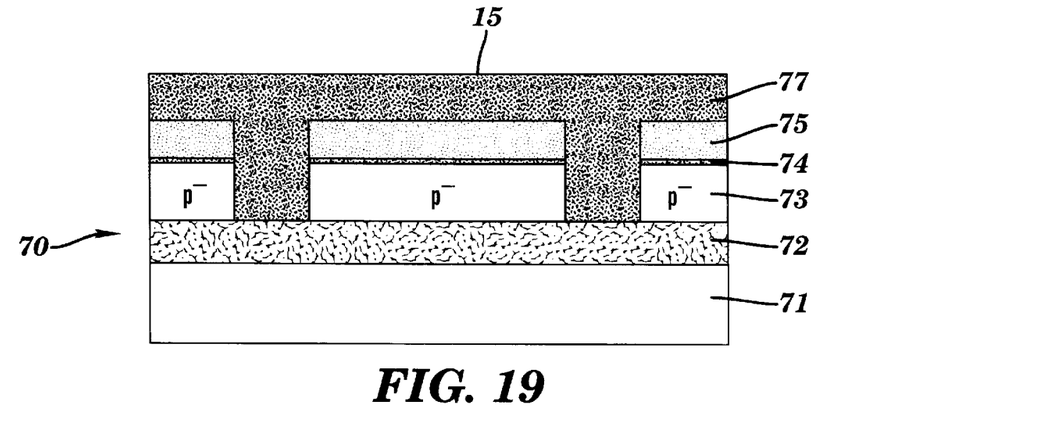
Figure 20:
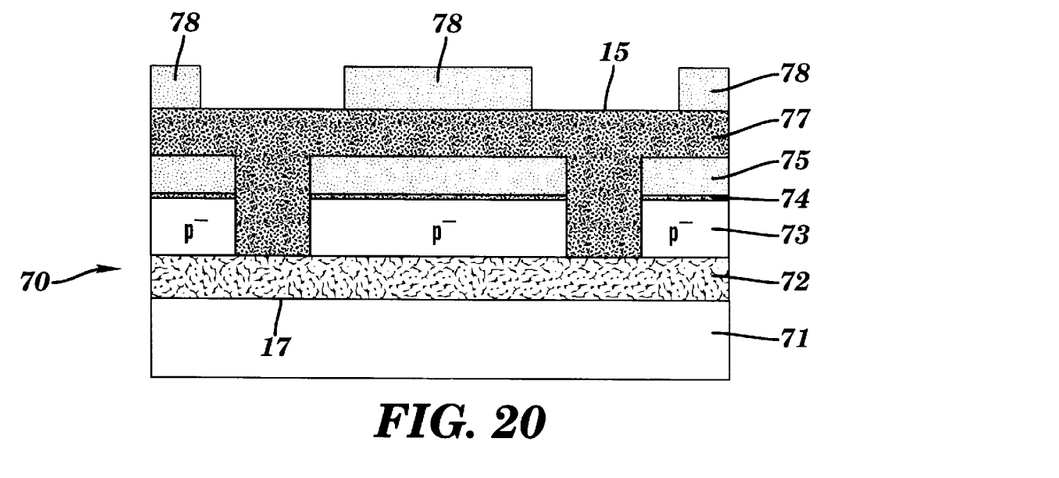
Figure 21:
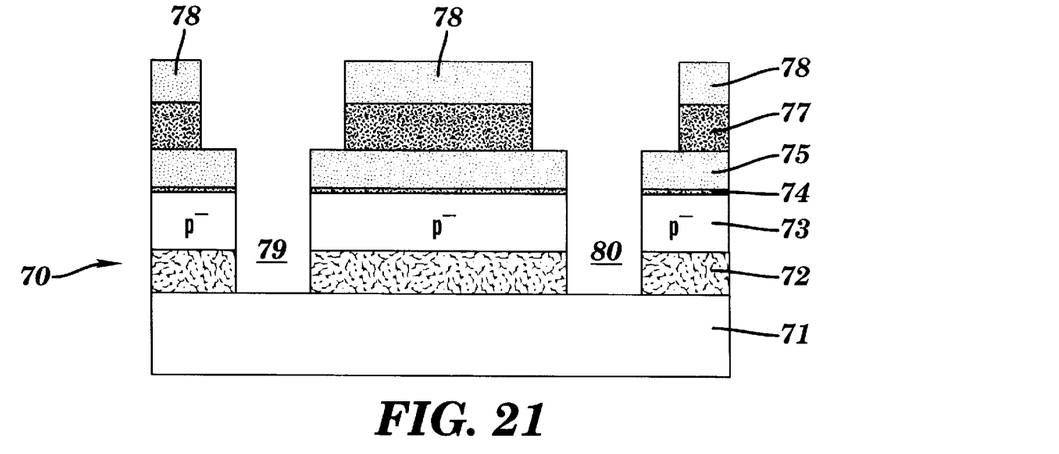

This fabrication process follows steps which are similar to steps in the first example. An STI oxide fill 77 (e.g., silicon dioxide or other dielectric material) is applied, as shown in FIG. 19, wherein the STI oxide fill 77 fills the troughs 76 and 18 (see FIG. 18) and covers the pad nitride layer 75. Then a BI resist mask 78 is applied and developed on a top surface 15 of the STI oxide fill 77, as shown in FIG. 20. A selective BI etch is then applied, as shown in FIG. 21, to etch out portions of the STI oxide fill 77 to form openings 79 and 80 where substrate conductive contacts will be formed. As a result of the selective BI etch, the STI oxide fill 77 has been reduced to a STI oxide layer 77 with isolated STI oxide portions (or regions), as shown. The STI oxide layer 77 will remain where substrate contacts are not to be formed so as to isolate silicon regions.

Figure 22:
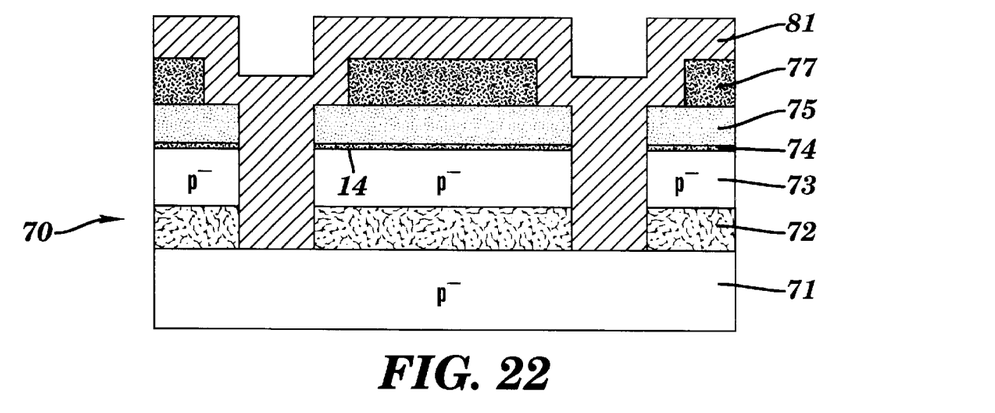
Figure 23:
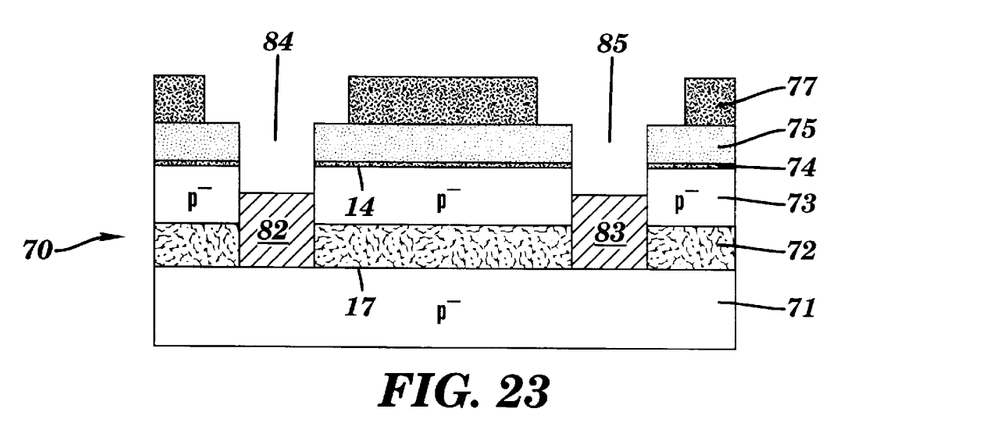

The BI resist mask 78 is then removed, and a poly layer 81 is deposited in the openings 79 and 80 and on the STI oxide layer 77, as shown in FIG. 22. The poly layer 81 is then etched back such as by using a RIE etch back, as shown in FIG. 23, to form poly buried contacts 82 and 83. The poly buried contacts 82 and 83 have been formed to extend from a top surface 17 of the silicon wafer substrate 71 to within a height range of the active silicon layer 73 (i.e, below a top surface 14 of the active silicon layer 73).

Figure 24:
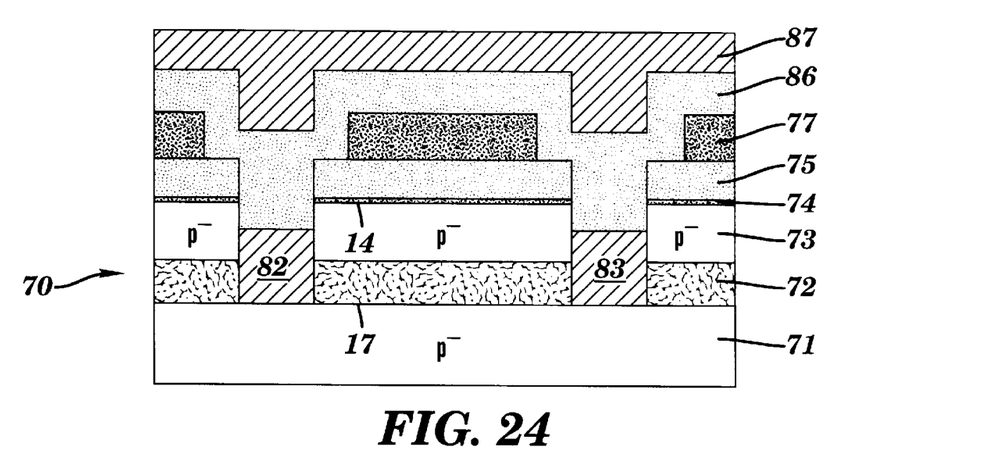

Recesses 84 and 85 above the buried contacts 82 and 83, respectively, are then filled with oxide 86 (e.g., silicon dioxide or other dielectric material) and a poly cap 87 is applied on the oxide 86, as shown in FIG. 24. As in the first example described above, the poly forming the buried contacts 82 and 83 can be doped with p-type or n-type dopants to provide desired electrical characteristics for the semiconductor device 70, or can be replaced with any of the electrically conductive materials described supra in conjunction with FIG. 9 for the poly 62.

Figure 25:
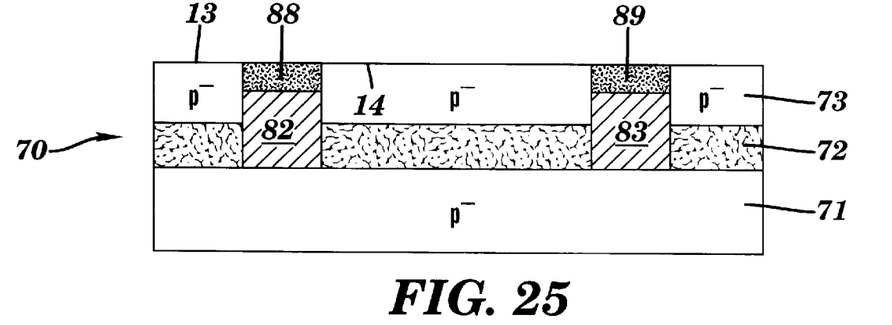

Polish and strip processes are performed to remove the poly cap 87, most of the oxide 86, the STI oxide layer 77, and the pad nitride layer 75, down to the top surface 14 of the active silicon layer 73, as shown in FIG. 25. Remaining portions of the oxide 86, namely an oxide 88 and an oxide 89, remain above each of the buried body contacts 82 and 83 in order to insulate the buried body contacts 82 and 83 from the surface 13 of the semiconductor device 70, and from any conductive matter (e.g., a gate of an FET) subsequently formed on the surface 13.

Figure 26:
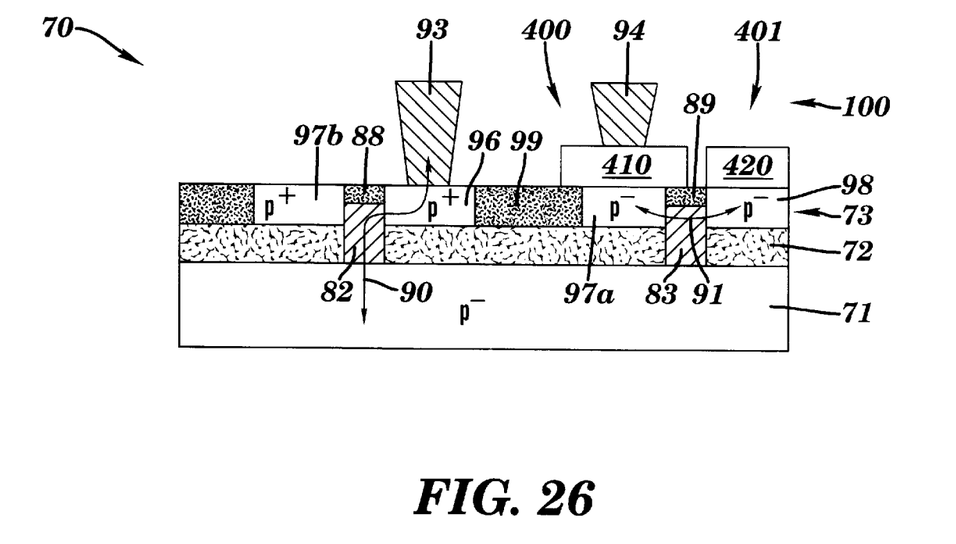

FIG. 26, which shows the final structure formed by the process of the second example, illustrates FIG. 25 after a contact layer 100 comprising conductive contacts 93, 94, and 95 has been formed on the active silicon layer 73 and conductively contacts isolated portions (or regions) 96, 97b, 97a, and 98, respectively, of the active silicon layer 73. An oxide 99 is within the indicated dotted lines. The oxide 99 would not be formed from the process steps described supra in conjunction with FIGS. 17–25. The oxide 99 would be formed, however, if the process described supra that formed the openings 76 and 18 shown in FIG. 18 also formed a third opening through the pad nitride layer 75 and the active silicon layer 73, between the openings 76 and 18. The third opening would be filled by the STI oxide fill 77 of FIG. 19 and would eventually result in the oxide 99 shown in FIG. 26.

Referring to the left half of FIG. 26, to make a substrate contact using this structure, the contact layer 100 directly contacts the adjacent active portion 96 of the active silicon layer 73 rather than the buried substrate contact 82. A conductive path 90 conductively links the conductive contact 93, the portion (or region) 96 of the active silicon layer 73, the substrate contact 82, and the silicon wafer substrate 71. Conduction path 91 connects bodies 97a and 98 of FETs 400 and 401 to the silicon wafer substrate 71 through body contact 83. The bodies 97a and 98 are portions (or regions) of the active silicon layer 73. Also shown is the polysilicon gate 410 disposed between the conductive contact 94 and the body 97a, and polysilicon gate 420 on the body 98.

The present invention is particularly suitable and useful for SRAM circuits. The SRAM circuits typically have a high number of features (e.g., 8 to 1,000 million) that require a relatively large amount of space. The present invention provides a dense configuration that does not take up any extra space, yet offers substantial improvements in cell stability.

The present invention also has application to numerous circuits other than SRAMs. For example, the present invention can be applied to other logic circuits, such as latches, sense-amplifiers, differential pairs, DRAMs, etc., where floating body effects are undesirable. In general, the present invention provides an improved way to make a body contact with any SOI device to reduce floating body effects.

By providing a p-doped poly contact from the NFET bodies to the substrate, all of the NFET bodies are fixed at ground potential (as in a bulk CMOS cell), thereby increasing the stability in the SOI device. Furthermore, the NFET Vt is raised (due to the grounded body), which will lower quiescent array power, further aid stability, and improve burn-in margins.

Other solutions are to raise Vt in the array and make larger NFETs (both W and L). However, these alternatives make the cell less dense and also result in a lower performance device.

Although this disclosure has focused mainly on NFETs, it should be appreciated that similar structures can also be applied to PFETs. Additionally, the buried body contact of the present invention is applicable, in addition to FETS, to any semiconductor device that can be formed in an active silicon layer of an SOI structure, such as, inter alia, diodes, bipolar transistors, resistors, capacitors, etc.

As stated supra, although the buried body contact was described herein as including $p^+$ doped, $p^-$ doped, or undoped polysilicon, the buried body contact of the present invention may include other conductive semiconductors, metals, or metallic alloys such as, inter alia, tungsten, aluminum, and other metals.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teachings without departing from the spirit and scope of the following claims.

We claim:

1. A method of forming and using a semiconductor structure, comprising the steps of:
   providing a silicon-on-insulator structure having a conductive substrate, an insulating layer on the conductive substrate, and a semiconductor device layer on the insulating layer, wherein the semiconductor device layer includes a semiconductor material;
   forming a first trough that extends through the semiconductor device layer and through the insulating layer; and
   forming a conductive buried body contact in the first trough and in conductive contact with the conductive substrate, wherein the buried body contact extends through the insulating layer and through less than a total thickness of the semiconductor device layer to a height H above a top surface of the conductive substrate, and wherein the buried body contact conductively contacts a region of the semiconductor device layer, said region including the semiconductor material.

2. The method of claim 1, wherein the buried body contact includes a polycrystalline silicon material.

3. The method of claim 1, further comprising placing a conductor on the region.

4. The method of claim 1, further comprising forming a dielectric layer on the buried body contact such that a top surface of the dielectric layer is about coplanar with a top surface of the semiconductor device layer.

5. The method of claim 4, further comprising:
   forming a second trough that extends through the semiconductor device layer and through the insulating layer; and
   forming a conductive substrate contact in the second trough and in conductive contact with the conductive substrate, wherein the substrate contact extends through the insulating layer and through a total thickness of the semiconductor device layer.

6. The method of claim 5, further comprising placing a conductor on the substrate contact.

7. The method of claim 5, further comprising after the providing step forming an oxide layer on the semiconductor device layer and forming a pad nitride layer on the oxide layer, and wherein the steps of forming a first trough, forming a buried body contact, forming a dielectric layer, forming a second trough, and forming a substrate contact comprise:

forming first and second etched holes that extend through the pad nitride layer, the oxide layer, and the semiconductor device layer, wherein the first etched hole has a narrower width than the second etched hole;

filling the first and second etched holes, and covering a top surface of the electronic structure, with a first dielectric layer;

applying a first mask over the first dielectric layer, wherein the first mask has first and second openings that correspond with the first and second etched holes, respectively, and wherein the second opening has a narrower width than the second etched hole;

forming third and fourth etched holes through the dielectric layer and through the insulating layer in locations that correspond to the first and second openings, respectively, wherein the third etched hole includes the first trough and the fourth etched hole includes the second trough;

removing the first mask;

filling the third and fourth etched holes with a polycrystalline silicon layer such that a depression is formed in the polycrystalline silicon layer at a location corresponding to the fourth etched hole;

applying a second mask over a second portion of the polycrystalline silicon layer and leaving an uncovered first portion of the polycrystalline silicon layer, wherein the second portion includes the depression, wherein the second mask fills the depression, wherein the first portion includes the third etched hole, and wherein the second portion includes the fourth etched hole;

etching away the first portion down to the height H in the first trough within the third etched hole, resulting in the buried body contact being formed to the height H in the first trough;

removing the second mask;

filling the first trough above the buried body contact, and covering the top surface of the electronic structure, with a second dielectric layer;

planarizing a top portion of the electronic structure down to a top surface of the first dielectric layer;

etching away the second portion down to the top surface of the semiconductor device layer, resulting in the substrate contact being formed in the second trough from the top surface of the conductive substrate to the top surface of the semiconductor device layer; and removing the first dielectric layer, the second dielectric layer, the pad nitride layer, and the oxide layer, down to the top surface of the semiconductor device layer, resulting in the dielectric layer being formed from a remaining portion of the second dielectric layer.

8. The method of claim 5, further comprising after the providing step forming an oxide layer on the semiconductor device layer and forming a pad nitride layer on the oxide layer, and wherein the steps of forming a first trough, forming a buried body contact, and forming a dielectric layer, comprise:

forming a first etched hole that extends through the pad nitride layer, the oxide layer, and the semiconductor device layer;

filling the first etched hole, and covering a top surface of the electronic structure, with a first dielectric layer;

applying a mask over the first dielectric layer, wherein the mask has an opening that correspond with the first etched hole;

forming a second etched hole through the dielectric layer and through the insulating layer at a location that correspond to the opening, wherein the second etched hole includes the first trough;

removing the mask;

filling the second etched hole, and covering the top surface of the electronic structure, with a first polycrystalline silicon layer, wherein a first recess is formed in the first polycrystalline silicon layer at a first location corresponding to the second etched hole;

etching away the first polycrystalline silicon layer down to the height H in the first trough within the second etched hole, resulting in the buried body contact being formed to the height H in the first trough;

filling the first trough above the buried body contact, and covering the top surface of the electronic structure, with a second dielectric layer such that a second recess is formed in the second dielectric layer at a second location corresponding to the second etched hole;

forming a polycrystalline silicon cap by filling the second recess, and covering the top surface of the electronic structure, with a second polycrystalline silicon layer; and removing the polycrystalline silicon cap, the second dielectric layer, the first dielectric layer, the pad nitride layer, and the oxide layer, down to the top surface of the semiconductor device layer, resulting in the dielectric layer being formed from a remaining portion of the second dielectric layer.

9. The method of claim 4, wherein the dielectric layer includes an oxide.

10. The method of claim 4, further comprising:

forming a gate dielectric on the region and on a portion of the dielectric layer; and forming a gate on the gate dielectric, wherein the dielectric layer provides insulative separation between the gate and the buried body contact.

11. The method of claim 10, wherein a thickness of the dielectric layer exceeds a thickness of the gate dielectric.

12. The method of claim 10, further comprising:

forming a source within the semiconductor device layer, wherein the source is positioned sidewise relative to a first side of the gate; and forming a drain within the semiconductor device layer, wherein the drain is positioned sidewise relative to a second side of the gate such that the region is disposed between the source and the drain, and wherein a field effect transistor (FET) has been formed such that the FET includes the source, the drain, the region, the gate, and the gate dielectric.

13. The method of claim 12, further comprising using the FET in a circuit selected from the group consisting of a logic circuit and a static random access memory (SRAM) circuit.

* * * * *